(12) United States Patent
Fan

(10) Patent No.: US 7,952,168 B2
(45) Date of Patent: May 31, 2011

(54) SUBSTRATE STRIP FOR SEMICONDUCTOR PACKAGES

(75) Inventor: Wen-Jeng Fan, Hsinchu (TW)

(73) Assignee: Powertech Technology Inc., Hsinchu (TW)

( * ) Notice: Subject to any disclaimer, the term of this patent is extended or adjusted under 35 U.S.C. 154(b) by 573 days.

(21) Appl. No.: 12/042,086

(22) Filed: Mar. 4, 2008

(65) Prior Publication Data

US 2009/0224395 A1 Sep. 10, 2009

(51) Int. Cl.
*H01L 23/544* (2006.01)
(52) U.S. Cl. ........................................ 257/620; 257/776
(58) Field of Classification Search .................. 257/620, 257/776, E21.524
See application file for complete search history.

(56) References Cited

U.S. PATENT DOCUMENTS

| 5,519,176 | A | * | 5/1996 | Goodman et al. | 174/255 |
| 5,923,539 | A | * | 7/1999 | Matsui et al. | 361/777 |
| 7,091,583 | B2 | * | 8/2006 | Chen et al. | 257/678 |
| 7,217,993 | B2 | * | 5/2007 | Nishimura | 257/686 |

* cited by examiner

*Primary Examiner* — Steven Loke
*Assistant Examiner* — Kimberly M Thomas
(74) *Attorney, Agent, or Firm* — Muncy, Geissler, Olds & Lowe, PLLC

(57) ABSTRACT

A substrate strip for semiconductor packages to slow the crack growth, primarily comprises a molding area and two side rails. The molding area includes a plurality of packaging units. The side rails are located outside the molding area and include two opposing longer sides of the substrate strip. A metal mesh is disposed on the side rails. The metal mesh consists of a plurality of crisscrossed wires having a plurality of isolated wire terminals at one edge of the metal mesh. Accordingly, crack growth is slowed by the specific metal mesh without damaging the packaging units. In one embodiment, the metal mesh is without boundary wires connecting to the isolated wire terminals to enhance the resistance to crack growth.

20 Claims, 2 Drawing Sheets

SUBSTRATE STRIP FOR SEMICONDUCTOR PACKAGES

FIELD OF THE INVENTION

The present invention relates to a printed circuit board, especially to a substrate strip for semiconductor packages to slow the growth of cracks.

BACKGROUND OF THE INVENTION

In the conventional semiconductor packaging processes, a substrate strip is used as a chip carrier for mounting a plurality of chips to meet the requirements of lower cost and mass production. The molding area on the substrate strip includes a plurality of packaging units arranged in an array. After semiconductor packaging processes such as die attachment, electrical connections, and molding, the substrate strip is singulated along the scribe lines between the package units to form a plurality of semiconductor packages. During handling and transporting of the semiconductor packaging processes, cracks will form on the side rails of the substrate strip due to stresses and friction. Moreover, the cracks grow due to more exerted stresses and extend into the molding area of the packaging units leading to damages of the electronic devices such as chips disposed on the packaging units.

SUMMARY OF THE INVENTION

The main purpose of the present invention is to provide a substrate strip for semiconductor packages to slow crack growth by the structure and the location of a metal mesh. It provides better stress distribution, and to reduce the moisture penetration.

The second purpose of the present invention is to provide a substrate strip for semiconductor packages to avoid cracks grow along plating bus line(s) into a molding area.

The third purpose of the present invention is to provide a substrate strip for semiconductor packages having the functions of enhanced ESD protections and of restrained crack growths.

The fourth purpose of the present invention is to provide a substrate strip for semiconductor packages to avoid the damages from ESD.

According to the present invention, a substrate strip for semiconductor packages primarily comprises a molding area and two side rails. The molding area includes a plurality of packaging units. The side rails are located outside the molding area and include two opposing longer sides of the substrate strip. A metal mesh disposed on the side rails. The metal mesh consists of a plurality of crisscrossed wires having a plurality of isolated wire terminals at one edge of the metal mesh.

DETAIL DESCRIPTION OF THE INVENTION

Please refer to the attached drawings, the present invention will be described by means of embodiment below.

Figure 1:
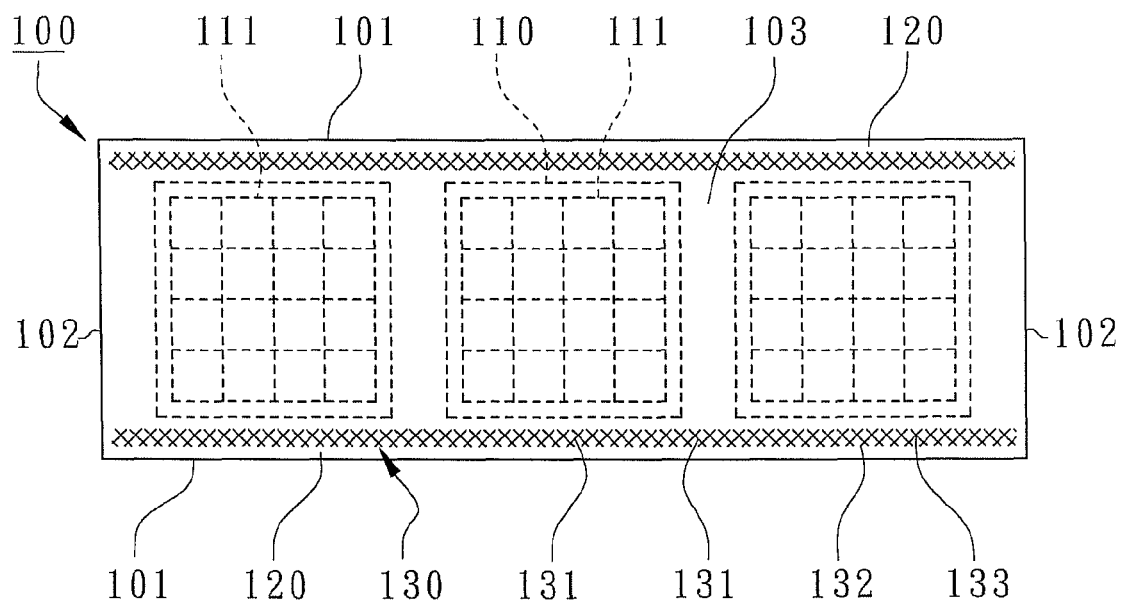
FIG. 1 shows a top view of a substrate strip for semiconductor packages according to the first embodiment of the present invention.
Figure 2:
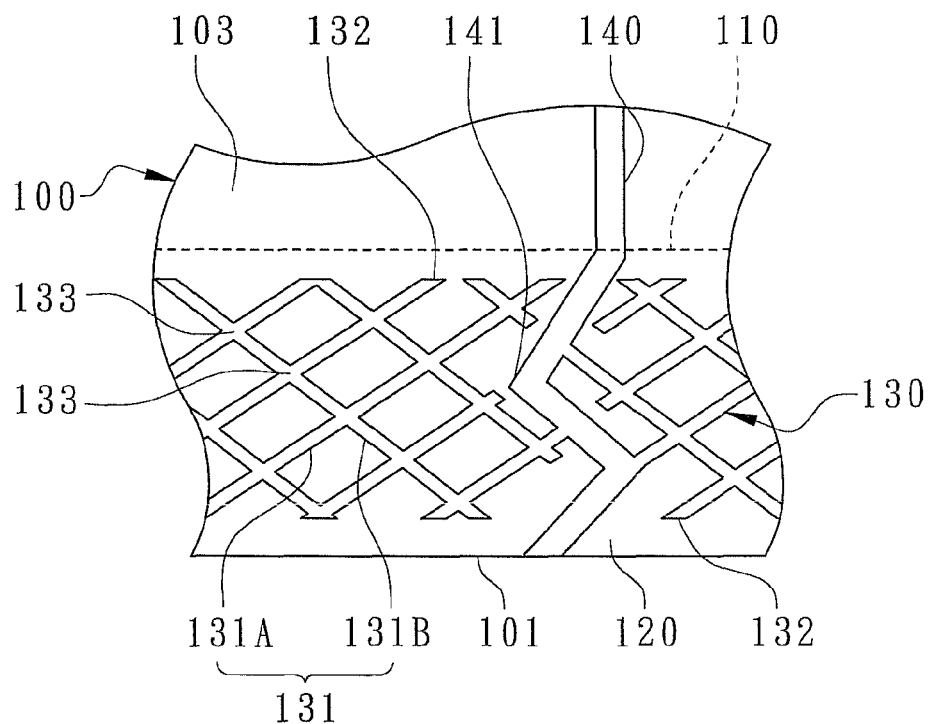
FIG. 2 shows a partially enlarged view of a metal mesh on the substrate strip according to the first embodiment of the present invention.
Figure 3:
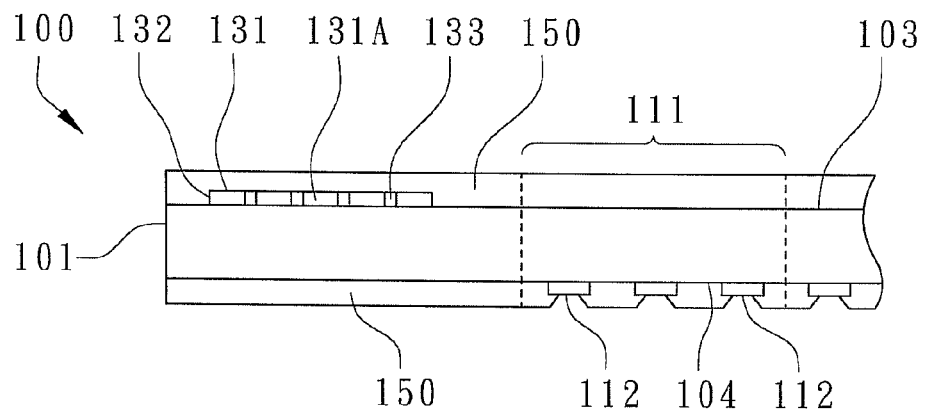
FIG. 3 shows a partially cross-sectional view of the substrate strip along one of the crisscrossed wires of the metal mesh according to the first embodiment of the present invention.

According to the first embodiment of the present invention, as shown in FIG. 1 to FIG. 3, a substrate strip for semiconductor packages is revealed. As shown in FIG. 1, a substrate strip 100 for semiconductor packages primarily comprises at least a molding area 110 and two side rails 120. The substrate strip 100 has two opposing longer sides 101 and two opposing shorter sides 102 perpendicular to the two opposing longer sides 101 where the lengths of the longer sides 101 are two times longer than the ones of the shorter sides 102, generally at least twice the lengths. To be more specific, as shown in FIG. 3, the substrate strip 100 further has a top surface 103 and a bottom surface 104. The molding area 110 has a circuit layer formed on the top surface 103, not shown in the figure. Normally, the substrate strip 100 can be a single-layer, a double-layer, or a multi-layer printed circuit board.

The molding area 110 includes a plurality of packaging units 111. The packaging units 111 mean the chip carriers of semiconductor packages to transmit the signals of the chips. After semiconductor packaging processes and singulation, each packaging unit 111 form a semiconductor package. In this embodiment, each molding area 110 includes sixteen or more which is not limited in the present embodiment. The packaging units 111 are arranged in an array within the molding area 110 and each packaging unit 111 is square or rectangular.

As shown in FIG. 1, the side rails 120 are located outside the molding area 110 and include the two opposing longer sides 101 of the substrate strip 100. A metal mesh 130 is disposed on the side rails 120 to enhance the anti-deformation capability of the substrate 100 without affecting the internal circuits of the packaging units 111. As shown in FIG. 2, the metal mesh 130 consists of a plurality of crisscrossed wires 131. The crisscrossed wires 131 have a plurality of isolated wire terminals 132 located at one edge of the metal mesh 130. The "isolated wire terminals" mean the isolated wire terminals 132 are not connected to a boundary wire around the metal mesh 130. In the present embodiment, the metal mesh 130 is located on the top surface 103 of the substrate strip 100 without boundary wires to enhance the resistance to crack growth. The material of the metal mesh 130 is the same as the one of a circuit layer on the top surface 103 of the substrate 100 such as copper, moreover, the metal mesh 130 can be formed at the same time as patterning the circuit layer during etching processes without increasing the manufacturing cost nor processing complexity of the substrate strip. The crisscrossed wires 131 are straight lines relatively inclined to the longer sides 101, i.e., the crisscrossed wires 131 are neither parallel nor perpendicular to the two longer sides 101. As shown in FIG. 2, the crisscrossed wires 131 include a plurality of first parallel lines 131A and a plurality of second parallel lines 131B where the first parallel lines 131A are parallel to each other by a first inclined angle and the second parallel lines 131B are parallel to each other by a second inclined angle. The first parallel lines 131A and the second parallel lines 131B are mutually interlaced to each other to form a plurality of intersections 133 to inhibit the growth of cracks and to avoid the extension of the cracks into the molding area 110. Preferably, the isolated wire terminals 132 are ended on the side rails 120 without extending to the two longer sides 101 of the substrate strip 100 to avoid the ESD damages. In a more specific embodiment, at least one or some of the isolated wire terminals 132 of the first parallel lines 131A and at least one or some of the isolated wire terminals 132 of the second parallel lines 131B are connected to form V-shaped (as shown in FIG. 2).

In a more specific embodiment, as shown in FIG. 2, the substrate strip 100 further comprises a plating bus line 140 extending into the molding area 110 through the metal mesh 130. The portion of the plating bus line 140 through the metal mesh 130 is not a straight line having at least a bend 141 with a shape like a lightning, to slow the growth of cracks along the plating bus line 140 into the molding area 110. As shown in FIG. 2, at least a crisscrossed wire 131 is connected to the plating bus line 140 where the intersections 133 are overlapped with the plating bus line 140. Therefore, the metal mesh 130 connected with the plating bus line 140 is configured to be a huge capacitor as a current buffer, any current surge does not directly flow into the molding area 110 through the plating bus line 140 but disperse among the metal mesh 130 to enhance ESD protection and to inhibit the growth of cracks.

To be more specific, as shown in FIG. 3, the substrate 100 further comprises a solder mask 150 formed on the top surface 103 which covers the metal mesh 130 including the isolated wire terminals 132 so that the metal mesh 130 does not need plating layer nor get rusty. To be more specific, each packaging unit 111 has a plurality of external pads 112 formed on the bottom surface 104 of the substrate strip 100. Another solder mask 150 covers the bottom surface 104 with the external pads 112 exposed. In the present embodiment, the packaging units 111 are BGA substrates and the external pads 112 are arranged in an array such as an array of ball pads. During semiconductor packaging processes, solder balls will be placed on the external pads 112 for bonding to an external printed circuit board, not shown in the figure. In a different embodiment, the packaging units 111 can be LGA substrates and the external pads 112 are an array of contact pads. Or, the packaging units 111 can be chip carriers for memory cards and the external pads 112 are gold fingers as electrical connecting terminals for power transmission and for data exchange.

Since the metal mesh 130 is without boundary wires surrounding its peripheries thereof, any growth of cracks may extend along the isolated wire terminals 132 of the crisscrossed wires 131 into the metal mesh 130 and end at the intersections 133. This is why the crack growth can be slowed and stopped. Moreover, through the design of metal mesh 130, the external stresses exerted on the substrate strip 100 during handling and transporting processes can be dispersed to avoid deformation of the substrate strip 100 leading to better qualities and higher yields of the substrate strip 100. Therefore, the substrate strip 100 in the present invention not only can inhibit the growth of cracks with better stress and current surge dispersion, but also avoid the penetration of moisture. Even if the substrate strip 100 is damaged and cracked, the intersections 133 of the metal mesh 130 can inhibit the growth of cracks without extending into molding area 110.

Figure 4:
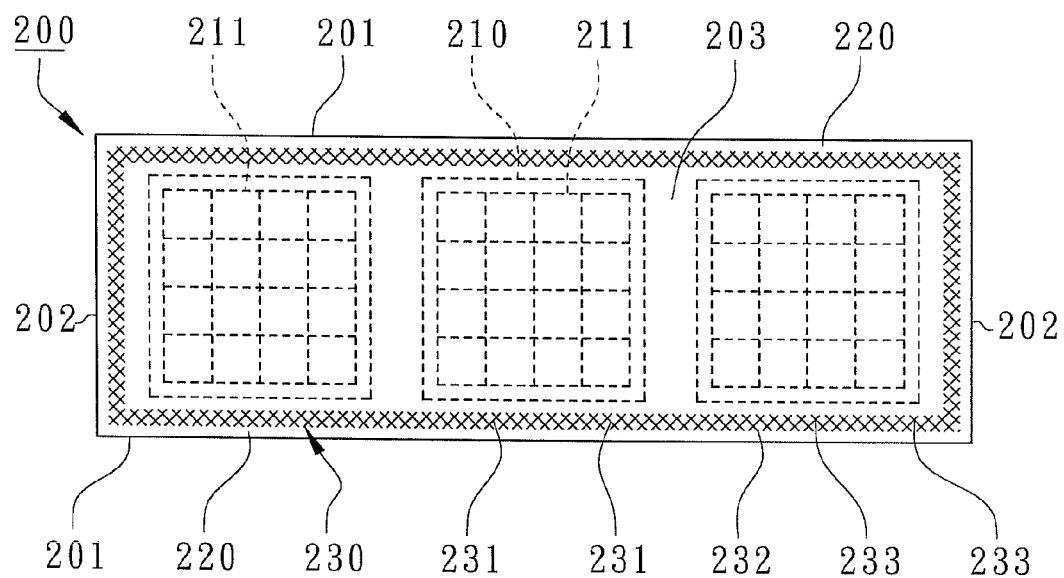
FIG. 4 shows a top view of another substrate strip for semiconductor packages according to the second embodiment of the present invention.

The numbers and the locations of metal meshes in the present invention are not limited. In the second embodiment of the present invention, as shown in FIG. 4, another substrate strip 200 for semiconductor packages is revealed, primarily comprising at least a molding area 210 and two side rails 220. The molding area 210 includes a plurality of packaging units 211. The side rails 220 are located outside the molding area 210 and include two opposing loner sides 201 of the substrate strip 200. A metal mesh 230 is disposed on the side rails 220. The metal mesh 230 consists of a plurality of crisscrossed wires 231 having a plurality of isolated wire terminals 232 located at one edge of the metal mesh 230. The crisscrossed wires 231 are mutually interlaced to each other formed a plurality of intersections 233. Accordingly, the specific metal mesh 230 is configured to slow the growth of cracks. As shown in FIG. 4 again, in the present embodiment, the metal mesh 230 is further disposed on the other peripheries of the substrate strip 200 including two opposing shorter sides 202 of the substrate strip 200 to encircle the molding areas 210 to provide better protection to the substrate strip 200. Preferably, the isolated wire terminals 232 may not extend into the longer sides 201 nor the shorter sides 202 of the substrate strip 200 to avoid ESD and singulation burrs.

The above description of embodiments of this invention is intended to be illustrative and not limiting. Other embodiments of this invention will be obvious to those skilled in the art in view of the above disclosure.

What is claimed is:

1. A substrate strip for semiconductor packages, comprising:
   at least a molding area including a plurality of packaging units;
   two side rails located outside the molding area and including two opposing longer sides of the substrate strip; and
   a metal mesh disposed on the side rails, wherein the metal mesh consists of a plurality of crisscrossed wires having a plurality of isolated wire terminals at one edge of the metal mesh,
   wherein the metal mesh is without boundary wires connecting to the isolated wire terminals.

2. The substrate strip as claimed in claim 1, wherein the crisscrossed wires are straight lines relatively inclined to the longer sides.

3. The substrate strip as claimed in claim 1, further comprising a plating bus line extending into the molding area through the metal mesh.

4. The substrate strip as claimed in claim 1, further comprising a solder mask covering the metal mesh including the isolated wire terminals.

5. The substrate strip as claimed in claim 1, wherein the packaging units are BGA substrates.

6. The substrate strip as claimed in claim 1, wherein the packaging units are LGA substrates.

7. The substrate strip as claimed in claim 1, wherein the packaging units are chip carriers for memory cards.

8. The substrate strip as claimed in claim 1, wherein the metal mesh is formed on a circuit surface of the substrate strip.

9. The substrate strip as claimed in claim 1, wherein the metal mesh is further disposed on the other peripheries of the substrate strip including two opposing shorter sides of the substrate strip to encircle the molding area.

10. A substrate strip for semiconductor packages, comprising:
    at least a molding area including a plurality of packaging units;
    two side rails located outside the molding area and including two opposing longer sides of the substrate strip;
    a metal mesh disposed on the side rails, wherein the metal mesh consists of a plurality of crisscrossed wires having a plurality of isolated wire terminals at one edge of the metal mesh; and
    a plating bus line extending into the molding area through the metal mesh.

11. The substrate strip as claimed in claim 10, wherein the plating bus line through the metal mesh is not a straight line having at least a bend.

12. The substrate strip as claimed in claim 10, wherein the crisscrossed wires include a plurality of first parallel lines and a plurality of second parallel lines where the first parallel lines and the second parallel lines are mutually interlaced to each other formed a plurality of intersections to inhibit cracks.

13. The substrate strip as claimed in claim 12, wherein at least one of the crisscrossed wires is connected with the plating bus line, and wherein the intersections are not overlapped with the plating bus line.

14. The substrate strip as claimed in claim 12, wherein at least one of the isolated wire terminals of the first parallel lines and at least one of the isolated wire terminals of the second parallel lines are connected to form V-shaped intersections.

15. A substrate strip for semiconductor packages, comprising:
    at least a molding area including a plurality of packaging units;
    two side rails located outside the molding area and including two opposing longer sides of the substrate strip; and
    a metal mesh disposed on the side rails, wherein the metal mesh consists of a plurality of crisscrossed wires having a plurality of isolated wire terminals at one edge of the metal mesh; wherein the metal mesh is without boundary wires connecting to the isolated wire terminals; wherein the isolated wire terminals are ended on the side rails without extending to two opposing longer sides of the substrate strip.

16. The substrate strip as claimed in claim 15, further comprising a solder mask covering the metal mesh including the isolated wire terminals.

17. The substrate strip as claimed in claim 15, wherein the packaging units are BGA substrates.

18. The substrate strip as claimed in claim 15, wherein the packaging units are chip carriers for memory cards.

19. The substrate strip as claimed in claim 15, wherein the metal mesh is formed on a circuit surface of the substrate strip.

20. The substrate strip as claimed in claim 15, wherein the metal mesh is further disposed on the other peripheries of the substrate strip including two opposing shorter sides of the substrate strip to encircle the molding area.

* * * * *